(12) United States Patent
Asari

(10) Patent No.: US 12,401,180 B2
(45) Date of Patent: Aug. 26, 2025

(54) ELECTRIC POWER DEVICE AND MOVING OBJECT WITH ELECTRIC POWER DEVICE

(71) Applicant: HONDA MOTOR CO., LTD., Tokyo (JP)

(72) Inventor: Norihiro Asari, Wako (JP)

(73) Assignee: HONDA MOTOR CO., LTD., Tokyo (JP)

(*) Notice: Subject to any disclaimer, the term of this patent is extended or adjusted under 35 U.S.C. 154(b) by 20 days.

(21) Appl. No.: 18/612,171

(22) Filed: Mar. 21, 2024

(65) Prior Publication Data

US 2024/0322541 A1 Sep. 26, 2024

(30) Foreign Application Priority Data

Mar. 23, 2023 (JP) .............................. 2023-046185

(51) Int. Cl.
| | |
|---|---|
| *B60R 16/023* | (2006.01) |
| *H01R 4/34* | (2006.01) |
| *H01R 4/58* | (2006.01) |
| *H02G 3/16* | (2006.01) |

(52) U.S. Cl.
CPC ........... *H02G 3/16* (2013.01); *B60R 16/0238* (2013.01); *H01R 4/34* (2013.01); *H01R 4/58* (2013.01)

(58) Field of Classification Search
CPC ................................................. B60R 16/0238
See application file for complete search history.

(56) References Cited

U.S. PATENT DOCUMENTS

| | | | | |
|---|---|---|---|---|
| 5,764,487 | A * | 6/1998 | Natsume | B60R 16/0238 361/823 |
| 2002/0050375 | A1* | 5/2002 | Sumida | H05K 7/026 174/50 |
| 2021/0066985 | A1* | 3/2021 | Tanouchi | H02K 3/50 |
| 2024/0088013 | A1* | 3/2024 | Kogure | H02K 11/27 |

FOREIGN PATENT DOCUMENTS

JP 3765229 B2 4/2006

* cited by examiner

*Primary Examiner* — Hung V Ngo
(74) *Attorney, Agent, or Firm* — Rankin, Hill & Clark LLP

(57) ABSTRACT

An electric power device for a moving object includes a direct current circuit and a support board. The support board electrically insulates a first circuit portion arranged on a first surface and a second circuit portion arranged on a second surface of the direct current circuit. A set of terminals consisting of a pair of a positive connection terminal and a negative connection terminal is arranged on the same side surface of the support board.

8 Claims, 10 Drawing Sheets

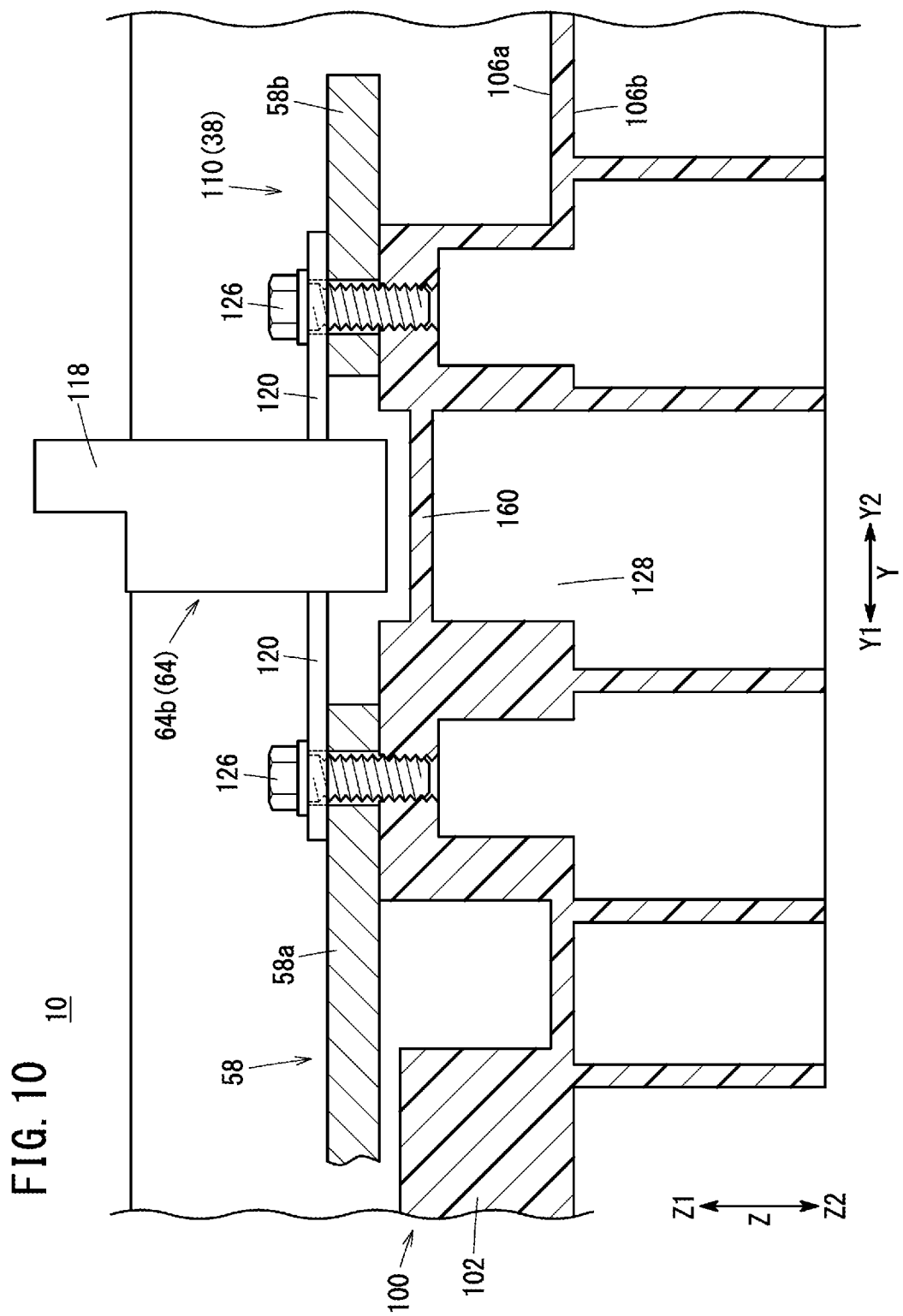

ELECTRIC POWER DEVICE AND MOVING OBJECT WITH ELECTRIC POWER DEVICE

CROSS-REFERENCE TO RELATED APPLICATIONS

This application is based upon and claims the benefit of priority from Japanese Patent Application No. 2023-046185 filed on Mar. 23, 2023, the contents of which are incorporated herein by reference.

BACKGROUND OF THE INVENTION

Field of the Invention

The present invention relates to an electric power device and a moving object with the electric power device.

Description of the Related Art

In recent years, efforts toward realization of low-carbon or decarbonized society have been activated, and research and development have been conducted on electric power devices for reducing $CO_2$ emission and improving energy efficiencies also in moving objects including aircrafts.

For example, JP 3765229 B2 discloses a junction box (electric power device) including a direct current circuit having a bus bar.

SUMMARY OF THE INVENTION

To provide an electric power device capable of reliably insulating a positive electrode and a negative electrode by a simple structure.

An object of the present invention is to solve the above-described problems.

One aspect of the present invention is to provide an electric power device including a direct current circuit and a support board having electrical insulation properties and configured to support the direct current circuit, where in the direct current circuit including a positive connection terminal and a negative connection terminal, each configured to be connected to an external circuit; a first circuit portion including a first bus bar electrically connected to one of the positive connection terminal or the negative connection terminal; and a second circuit portion including a second bus bar electrically connected to another of the positive connection terminal or the negative connection terminal, the first circuit portion disposed on a first surface of the support board and the second circuit portion disposed on a second surface of the support board are electrically separated from each other by the support board, and a set of the positive connection terminal and the negative connection terminal which are paired is arranged on a same side surface of the support board.

Another aspect of the present invention is a moving object including the electric power device described above.

According to the present invention, the positive electrode and the negative electrode can be reliably insulated.

The above and other objects features and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 10 is a cross-sectional view showing an electric power device according to a modification.

DETAILED DESCRIPTION OF THE INVENTION

Figure 1:
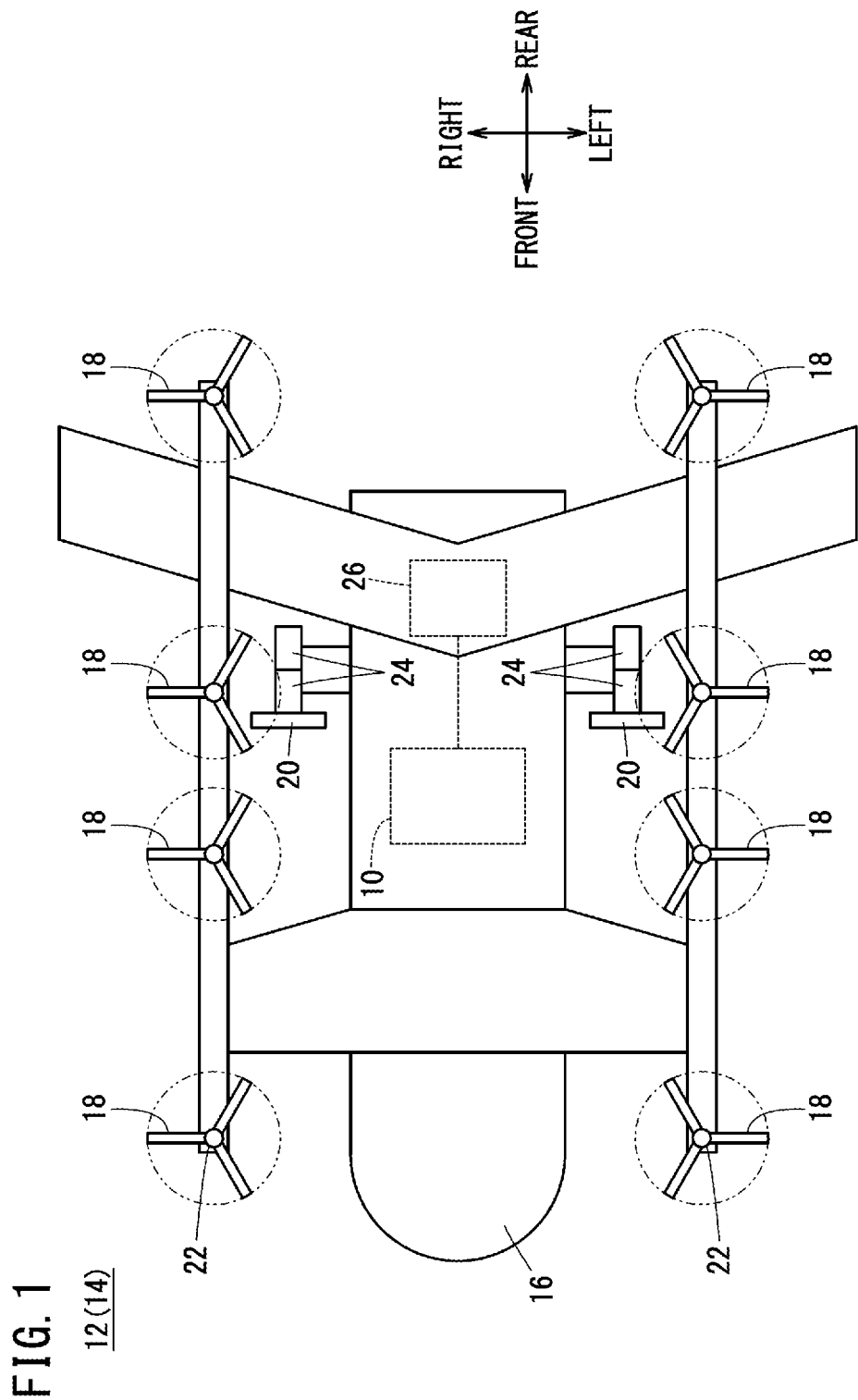
FIG. 1 is a schematic view of an aircraft according to an embodiment of the present invention.

An electric power device 10 and a moving object 12 equipped with the electric power device 10 according to an embodiment of the present invention will be described below with reference to the drawings. As shown in FIG. 1, the electric power device 10 according to the present embodiment is mounted on, for example, an aircraft 14 as the moving object 12. The aircraft 14 is an electric vertical take-off and landing (eVTOL) aircraft.

The aircraft 14 includes a fuselage 16, eight VTOL rotors 18, and two cruise rotors 20. The VTOL rotors 18 generate a thrust in the vertical direction on the aircraft 14. One VTOL motor 22 is connected to each VTOL rotor 18. The VTOL rotor 18 is rotated by the VTOL motor 22. The cruise rotors 20 generate a thrust in the horizontal direction on the aircraft 14. Two cruise motors 24 are connected to each cruise rotor 20. The cruise rotor 20 is rotated by the cruise motor 24. The number of VTOL rotors 18, VTOL motors 22, cruise rotors 20, and cruise motors 24 can be set as desired.

Figure 2:
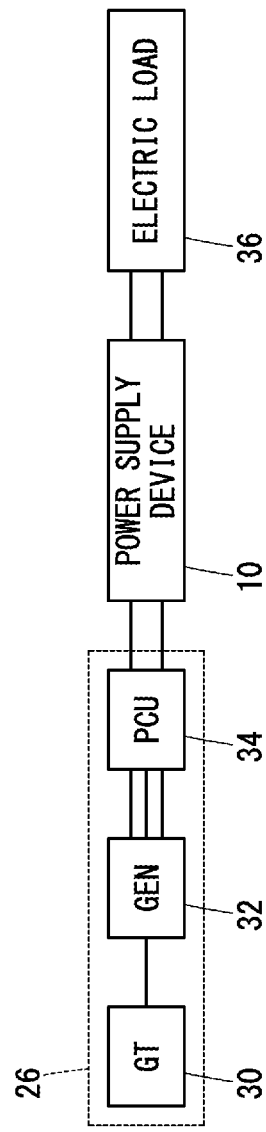
FIG. 2 is a block diagram showing a power generation module and an electric power device.

A power generation module 26 and the electric power device 10 are disposed inside the fuselage 16. As shown in FIG. 2, the power generation module 26 includes an engine 30, a generator 32, and a power control unit (PCU) 34. The engine 30 is, for example, a gas turbine engine, but is not limited thereto. The generator 32 generates power by being driven by the engine 30. The PCU 34 converts the three phase power generated by the power generator 32 into DC power.

The electric power device 10 is a junction box for supplying DC power supplied from the PCU 34 to an electric load 36. The electric load 36 includes various electronic devices such as the VTOL motors 22, the cruise motors 24, and inverters. The moving object 12 may not be limited to an aircraft and may be, for example, a vehicle, a ship, or the like. The electric power device 10 is not necessarily mounted on the moving object 12.

Figure 3:
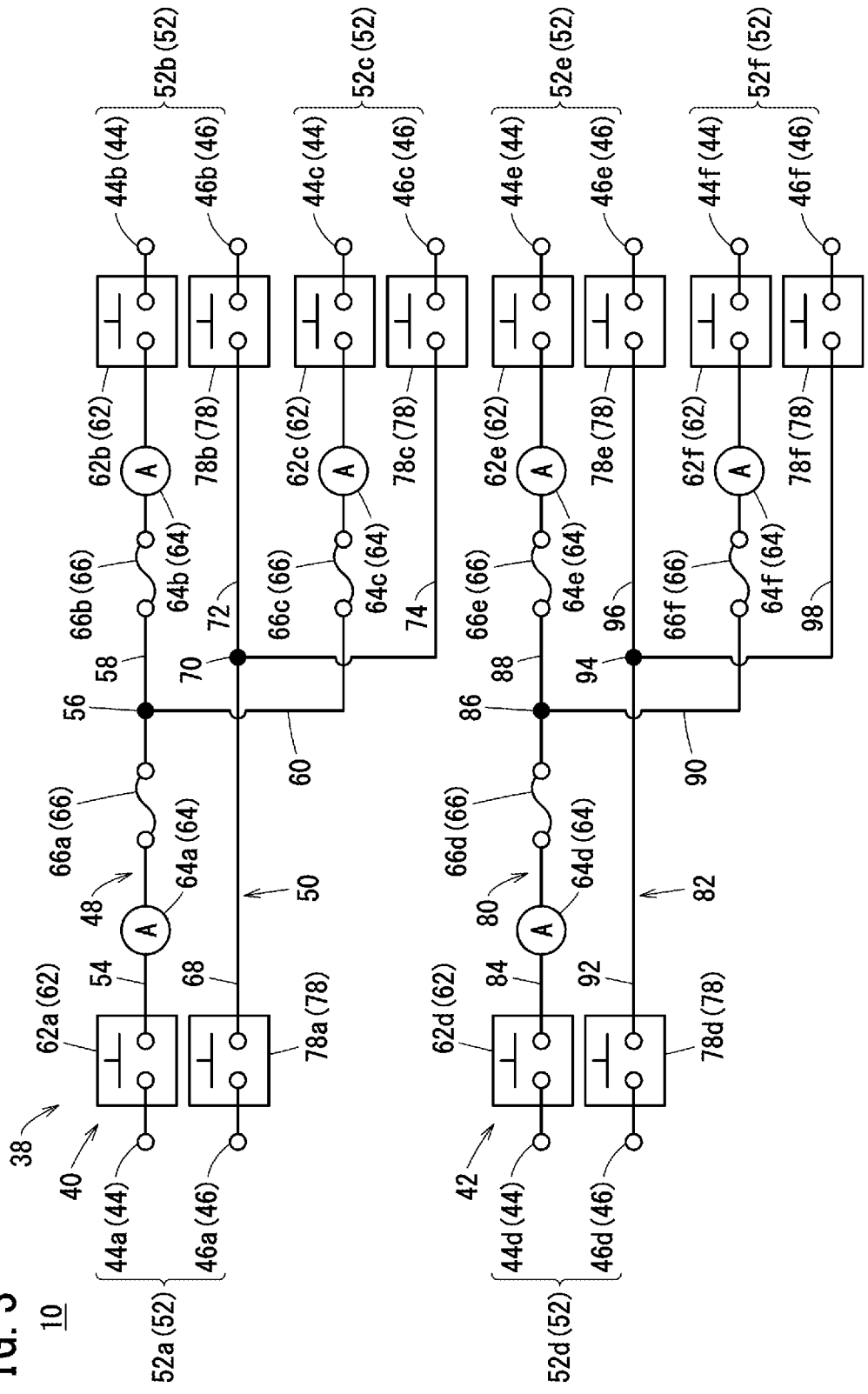
FIG. 3 is a circuit diagram of the electric power device.

As shown in FIG. 3, the electric power device 10 includes a direct current circuit 38. The direct current circuit 38 includes a first electric circuit 40 and a second electric circuit 42. The first electric circuit 40 includes a plurality of positive connection terminals 44, a plurality of negative connection terminals 46, a first positive circuit portion 48, and a first negative circuit portion 50. The positive connection terminal 44 and the negative connection terminal 46 of the first electric circuit 40 are electrically connected to an external circuit.

The first electric circuit 40 includes a first positive connection terminal 44a, a second positive connection terminal 44b, and a third positive connection terminal 44c as the plurality of positive connection terminals 44. The first electric circuit 40 includes a first negative connection terminal 46a, a second negative connection terminal 46b, and a third negative connection terminal 46c as the plurality of negative connection terminals 46.

The first positive connection terminal 44a and the first negative connection terminal 46a form a first set of terminals 52a. The first set of terminals 52a is electrically connected to the PCU 34. The second positive connection terminal 44b and the second negative connection terminal 46b form a second set of terminals 52b. The electric power output via the second set of terminals 52b is supplied to, for example, two of the VTOL motors 22 and one of the cruise motors 24. The third positive connection terminal 44c and the third negative connection terminal 46c form a third set of terminals 52c. The electric power output via the third set of terminals 52c is supplied to, for example, two of the VTOL motors 22 and one of the cruise motors 24.

The first positive circuit portion 48 electrically connects the first positive connection terminal 44a, the second positive connection terminal 44b, and the third positive connection terminal 44c to each other. The first positive circuit portion 48 includes a first positive conductor 54, a first junction 56, a second positive conductor 58, and a third positive conductor 60.

The first positive conductor 54 electrically connects the first positive connection terminal 44a and the first junction 56 to each other. The second positive conductor 58 electrically connects the first junction 56 and the second positive connection terminal 44b to each other. The third positive conductor 60 electrically connects the first junction 56 and the third positive connection terminal 44c to each other. The first to third positive conductors 54, 58, 60 are each provided with a positive contactor 62, an ammeter 64, and a fuse 66.

The first negative circuit portion 50 electrically connects the first negative connection terminal 46a, the second negative connection terminal 46b, and the third negative connection terminal 46c to each other. The first negative circuit portion 50 includes a first negative conductor 68, a first junction 70, a second negative conductor 72, and a third negative conductor 74.

The first negative conductor 68 electrically connects the first negative connection terminal 46a and the first junction 70 to each other. The second negative conductor 72 electrically connects the first junction 70 and the second negative connection terminal 46b to each other. The third negative conductor 74 electrically connects the first junction 70 and the third negative connection terminal 46c to each other. The first to third negative conductors 68, 72, 74 are provided with one negative contactor 78 each.

The second electric circuit 42 includes a plurality of positive connection terminals 44, a plurality of negative connection terminals 46, a second positive circuit portion 80, and a second negative circuit portion 82. The positive connection terminal 44 and the negative connection terminal 46 of the second electric circuit 42 are electrically connected to an external circuit.

The second electric circuit 42 includes a fourth positive connection terminal 44d, a fifth positive connection terminal 44e, and a sixth positive connection terminal 44f as the plurality of positive connection terminals 44. The second electric circuit 42 includes a fourth negative connection terminal 46d, a fifth negative connection terminal 46e, and a sixth negative connection terminal 46f as the plurality of negative connection terminals 46.

The fourth positive connection terminal 44d and the fourth negative connection terminal 46d form a fourth set of terminals 52d. The fourth set of terminals 52d is electrically connected to the PCU 34. The fifth positive connection terminal 44e and the fifth negative connection terminal 46e form a fifth set of terminals 52e. The electric power output via the fifth set of terminals 52e is supplied to, for example, two of the VTOL motors 22 and one of the cruise motors 24. The sixth positive connection terminal 44f and the sixth negative connection terminal 46f form a sixth set of terminals 52f. The electric power output via the sixth set of terminals 52f is supplied to, for example, two of the VTOL motors 22 and one of the cruise motors 24.

The second positive circuit portion 80 electrically connects the fourth positive connection terminal 44d, the fifth positive connection terminal 44e, and the sixth positive connection terminal 44f to each other. The second positive circuit portion 80 includes a fourth positive conductor 84, a second junction 86, a fifth positive conductor 88 and a sixth positive conductor 90.

The fourth positive conductor 84 electrically connects the fourth positive connection terminal 44d and the second junction 86 to each other. The fifth positive conductor 88 electrically connects the second junction 86 and the fifth positive connection terminal 44e to each other. The sixth positive conductor 90 electrically connects the second junction 86 and the sixth positive connection terminal 44f to each other. The fourth to sixth positive conductors 84, 88, 90 are each provided with the positive contactor 62, an ammeter 64, and a fuse 66.

The second negative circuit portion 82 electrically connects the fourth negative connection terminal 46d, the fifth negative connection terminal 46e, and the sixth negative connection terminal 46f to each other. The second negative circuit portion 82 includes a fourth negative conductor 92, a second junction 94, a fifth positive conductor 96 and a sixth negative conductor 98.

The fourth negative conductor 92 electrically connects the fourth negative connection terminal 46d and the second junction 94 to each other. The fifth negative conductor 96 electrically connects the second junction 94 and the fifth negative connection terminal 46e to each other. The sixth negative conductor 98 electrically connects the second junction 94 and the sixth negative connection terminal 46f to each other. The fourth to sixth negative conductors 92, 96, 98 are provided with one negative contactor 78 each.

As shown in FIGS. 4 to 7, the electric power device 10 includes a support board 100 that supports the direct current circuit 38 and has electrical insulation properties. The support board 100 includes a plate-shaped support main body 102 and a peripheral wall 104 (see FIG. 8). The support main body 102 is formed in a quadrangular shape in a front view shown in FIG. 4.

As shown in FIGS. 4 to 9, the support main body 102 has a first surface 106a as one surface and a second surface 106b as the other surface. The first surface 106a faces in the arrow Z1 direction, and the second surface 106b faces in the arrow Z2 direction.

Figure 4:
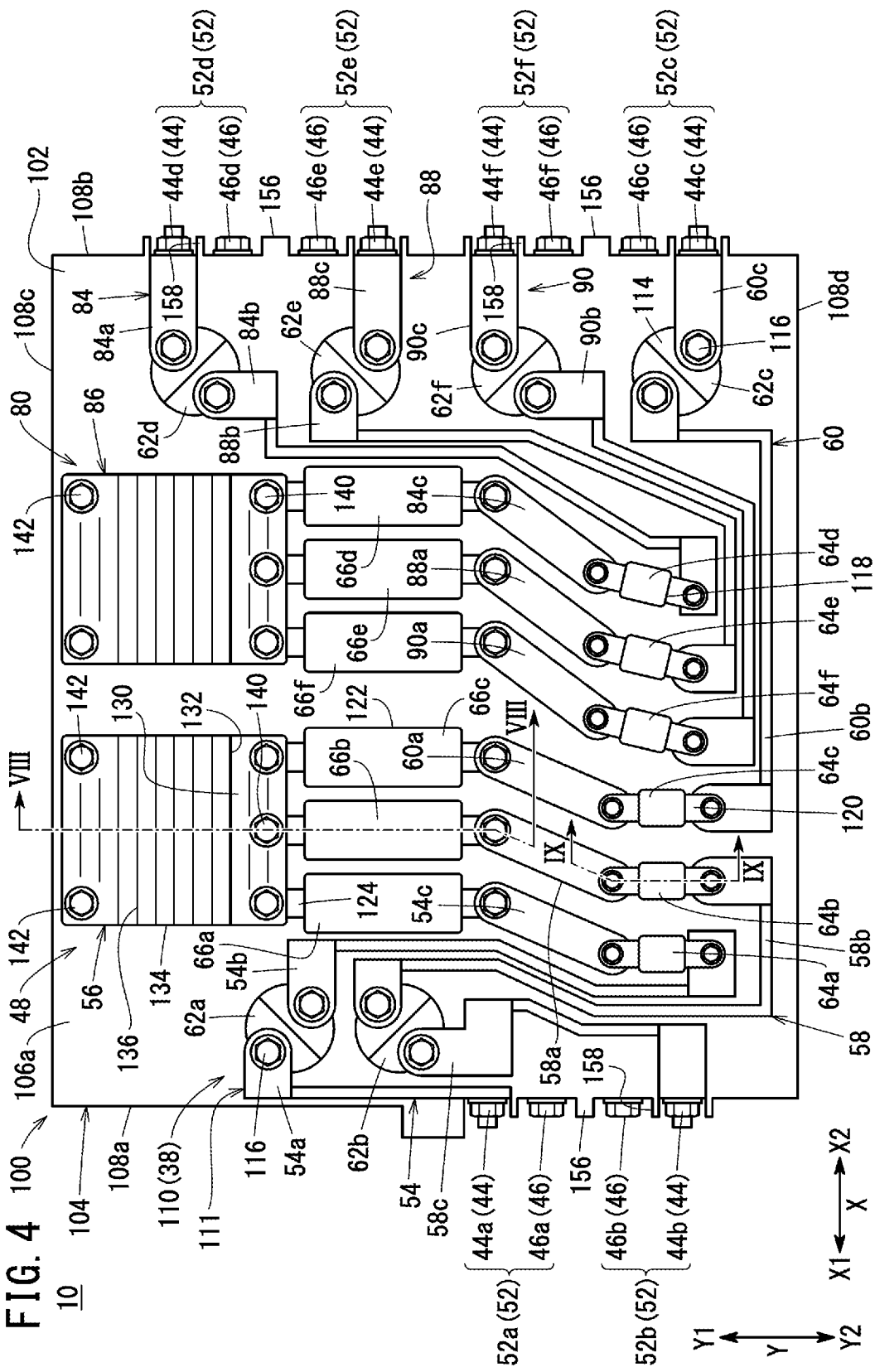
FIG. 4 is a front view of the electric power device.
Figure 5:
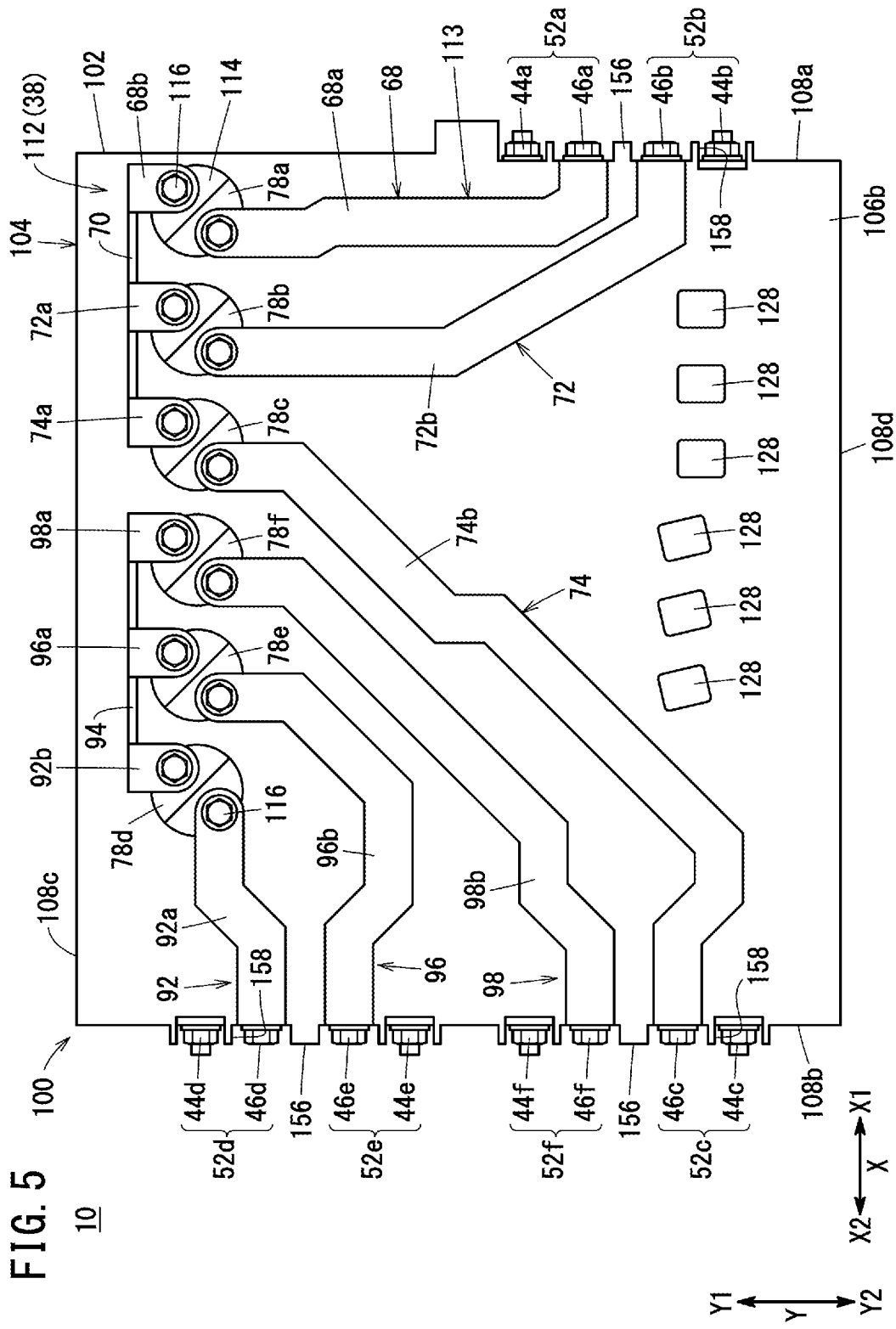
FIG. 5 is a rear view of the electric power device.

As shown in FIGS. 4 and 5, the peripheral wall 104 surrounds the outer periphery of the support main body 102. The peripheral wall 104 protrudes from the support main body 102 in the arrow Z1 direction and the arrow 22 direction (see FIG. 8). The peripheral wall 104 has a first side surface 108a, a second side surface 108b, a third side surface 108c, and a fourth side surface 108d. The first side surface 108a faces in the arrow X1 direction, and the second side surface 108b faces in the arrow X2 direction. That is, the first side surface 108a and the second side surface 108b face in opposite directions. The third side surface 108c faces in the arrow Y1 direction, and the fourth side surface 108d faces in the arrow Y2 direction.

As shown in FIG. 4, a first circuit portion 110 including the first positive circuit portion 48 and the second positive circuit portion 80 are disposed on the first surface 106a of the support board 100. The first circuit portion 110 includes a plurality of first bus bars 111.

As shown in FIG. 5, a second circuit portion 112 including the first negative circuit portion 50 and the second negative circuit portion 82 is disposed on the second surface 106b of the support board 100. The second circuit portion 112 includes a plurality of second bus bars 113.

Figure 6:
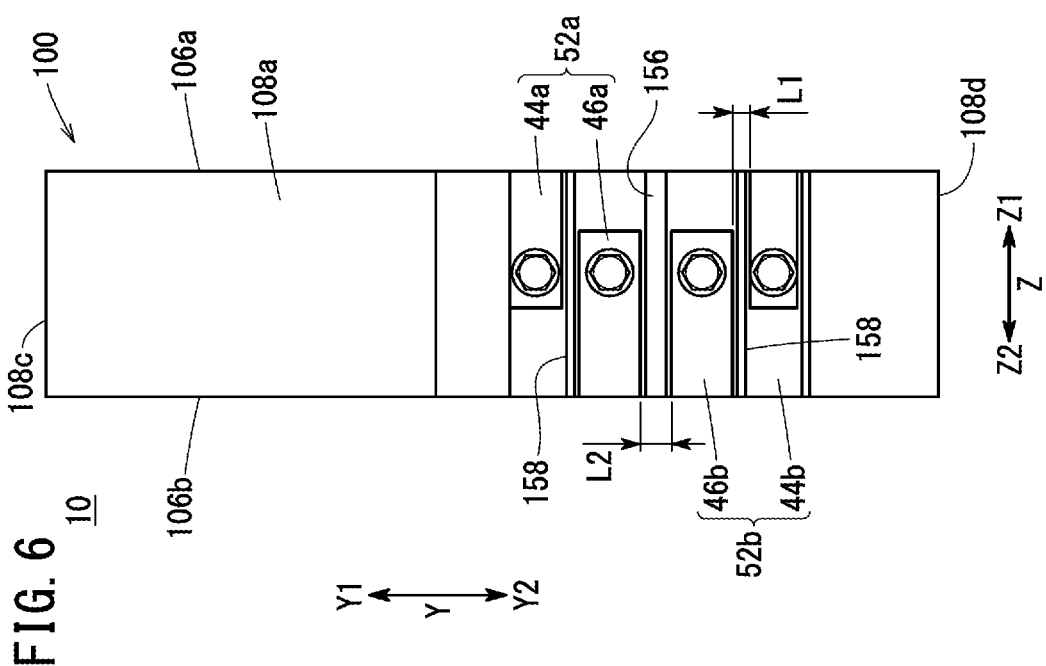
FIG. 6 is a side view of the electric power device.
Figure 7:
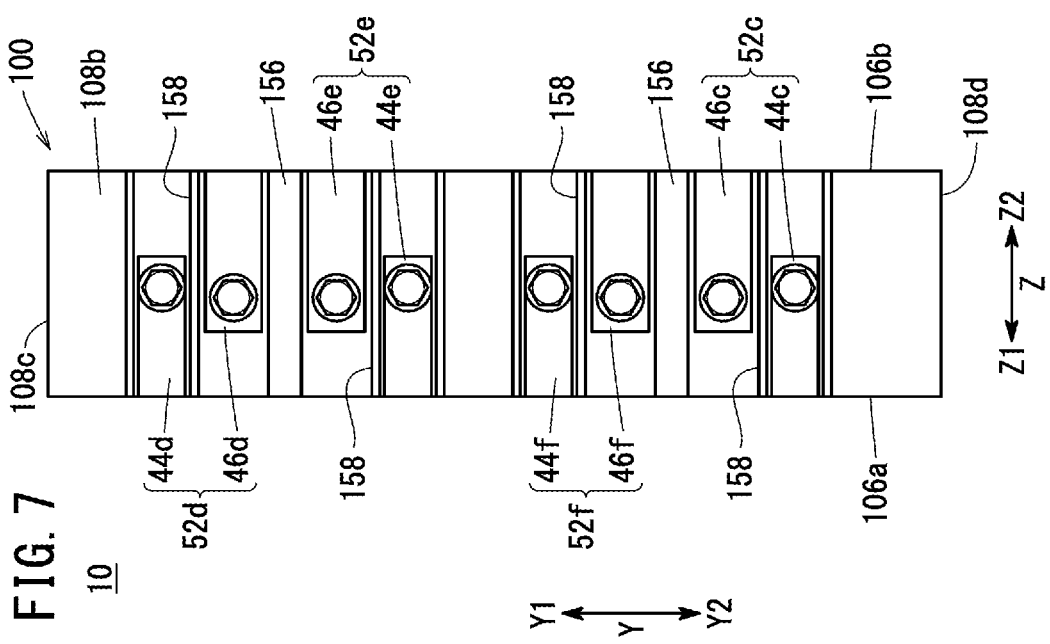
FIG. 7 is a side view of the electric power device.

As shown in FIG. 6, the first side surface 108a of the support board 100 is provided with the first set of terminals 52a and the second set of terminals 52b. As shown in FIG. 7, the third set of terminals 52c, the fourth set of terminals 52d, the fifth set of terminals 52e, and the sixth set of terminals 52f are disposed on the second side surface 108b of the support board 100. As shown in FIGS. 6 and 7, the positive connection terminals 44 and the second surface 106b of the support board 100 are separated from each other. The negative connection terminals 46 and the first surface 106a of the support board 100 are separated from each other.

As shown in FIG. 4, only the first circuit portion 110 is arranged on the first surface 106a of the support board 100, and the second circuit portion 112 is not arranged thereon. As shown in FIG. 5, only the second circuit portion 112 is arranged on the second surface 106b of the support board 100, and the first circuit portion 110 is not arranged thereon. That is, the first circuit portion 110 and the second circuit portion 112 are electrically separated by the support board 100 having electrical insulation properties. The support board 100 has electrical insulation properties and a certain thickness. Therefore, the first circuit portion 110 and the second circuit portion 112 can be reliably insulated from each other by the support board 100.

Hereinafter, the arrangement structure of the direct current circuit 38 with respect to the support board 100 will be described in detail. As shown in FIG. 4, the first circuit portion 110 includes six positive contactors 62, six ammeters 64, and six fuses 66. As shown in FIG. 5, the second circuit portion 112 includes six negative contactors 78.

Figure 8:
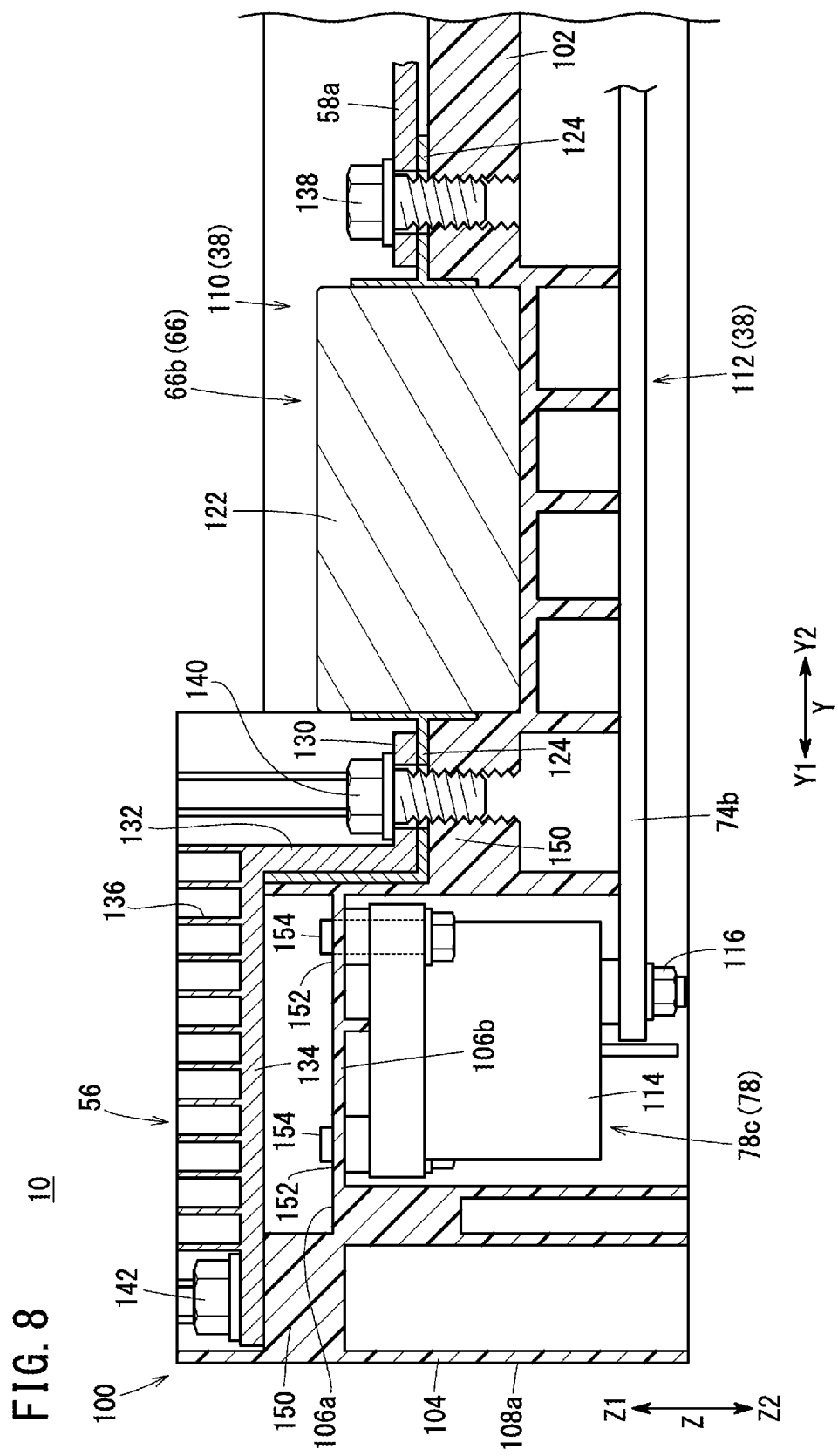
FIG. 8 is a cross-sectional view taken along line VIII-VIII of FIG. 4.

As shown in FIG. 4, the six positive contactors 62 connect or disconnect the first to sixth positive conductors 54, 58, 60, 84, 88, 90. As shown in FIG. 5, the six negative contactors 78 connect or disconnect the first to sixth negative conductors 68, 72, 74, 92, 96, 98. As shown in FIGS. 5 and 8, the negative contactor 78 includes a contactor body 114 and a pair of contact points 116. The contactor body 114 is formed in a columnar shape, for example. The pair of contact points 116 are provided, for example, on an end surface of the contactor body 114. The positive contactor 62 has the same configuration as the negative contactor 78.

Figure 9:
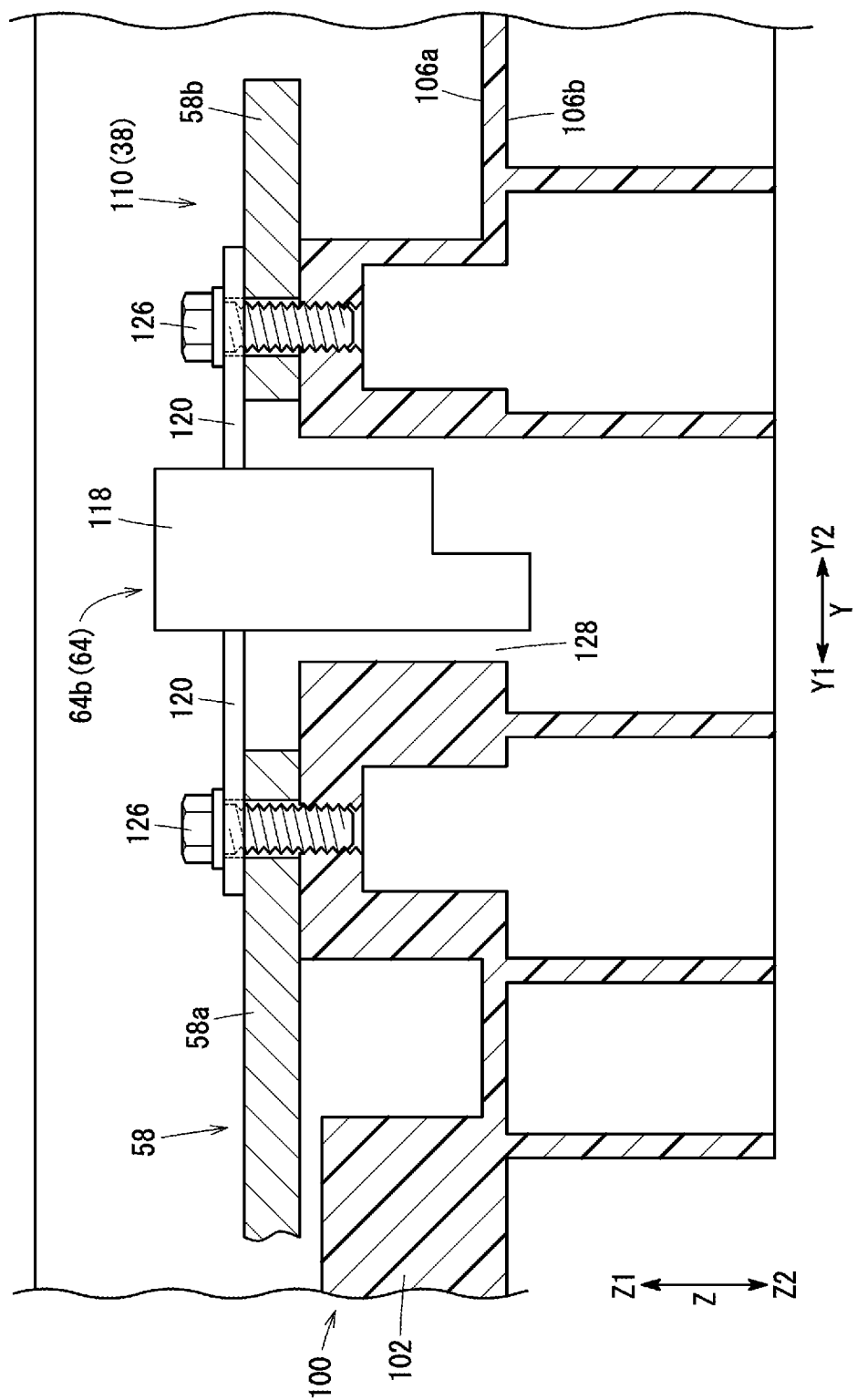
FIG. 9 is a cross-sectional view taken along line IX-IX of FIG. 4.

As shown in FIG. 4, the six ammeters 64 measure currents flowing through the first to sixth positive conductors 54, 58, 60, 84, 88, 90. As shown in FIG. 9, the ammeter 64 includes a base portion 118 and a pair of contact points 120. The base portion 118 extends in one direction (the arrow Z direction). The base portion 118 is formed in a rectangular parallelepiped shape, for example. The pair of contact points 120 protrude from the base portion 118 in opposite directions (the arrow Y direction). The pair of contact points 120 are provided at one end portion of the base portion 118 in the extending direction.

As shown in FIG. 4, when an excessive current over the upper limit value flows through any one of the first to sixth positive conductors 54, 58, 60, 84, 88, 90, corresponding one of the six fuses 66 interrupts the current flowing through the one of the first to sixth positive conductors 54, 58, 60, 84, 88, 90. As shown in FIG. 8, the fuse 66 includes a fuse body 122 and a pair of contact points 124. The fuse body 122 extends in one direction (the arrow Y direction). The pair of contact points 124 are provided at both ends of the fuse body 122 in the longitudinal direction.

Hereinafter, the positive contactors 62 provided in the first to sixth positive conductors 54, 58, 60, 84, 88, 90 may be referred to as first to sixth positive contactors 62a to 62f. The negative contactors 78 provided in the first to sixth negative conductors 68, 72, 74, 92, 96, 98 may be referred to as first to sixth negative contactors 78a to 78f.

As shown in FIG. 4, the first to sixth positive contactors 62a to 62f, the six ammeters 64, and the six fuses 66 are attached to the first surface 106a of the support board 100. The first to sixth positive contactors 62a to 62f are fixed to the first surface 106a of the support board 100 by bolts (not shown).

The first positive contactor 62a and the second positive contactor 62b are arranged along the first side surface 108a of the support board 100. The first positive contactor 62a is positioned in the direction of the arrow Y1 with respect to the second positive contactor 62b. The third positive contactor 62c, the fourth positive contactor 62d, the fifth positive contactor 62e, and the sixth positive contactor 62f are disposed along the second side surface 108b of the support board 100. The fourth positive contactor 62d, the fifth positive contactor 62e, the sixth positive contactor 62f, and the third positive contactor 62c are arranged in this order in the arrow Y2 direction.

The six ammeters 64 are arranged along the fourth side surface 108d. In other words, the six ammeters 64 are arranged along the arrow X direction. The ammeters 64 are fixed to the support board 100 by bolts 126 (see FIG. 9). The six fuses 66 are arranged in the arrow X direction in the central portion of the first surface 106a of the support board 100. The fuses 66 are fixed to the support board 100 by bolts 138, 140 (see FIG. 8).

Hereinafter, the ammeters 64 provided in the first to sixth positive conductors 54, 58, 60, 84, 88, 90 may be referred to as first to sixth ammeters 64a to 64f. The fuses 66 provided in the first to sixth positive conductors 54, 58, 60, 84, 88, 90 may be referred to as first to sixth fuses 66a to 66f.

As shown in FIGS. 4 and 6, the first positive connection terminal 44a is disposed on the first side surface 108a. The first positive connection terminal 44a extends from the middle portion of the first side surface 108a in the arrow Z direction to the first surface 106a of the support board 100.

As shown in FIG. 4, a first positive conductor 54 is electrically connected to the first positive connection terminal 44a. The first positive conductor 54 includes three first positive bus bars 54a to 54c as first bus bars 111. The first positive bus bar 54an electrically connects the first positive connection terminal 44a and one of the contact points 116 of the first positive contactor 62a to each other. The first positive bus bar 54a extends from the first positive connection terminal 44a in the arrow Y1 direction.

The first positive bus bar 54b electrically connects the other of the contact points 116 of the first positive contactor 62a and the first ammeter 64a to each other. The first positive bus bar 54b extends from the first positive contactor 62a in the arrow Y2 direction.

The first positive bus bar 54c electrically connects the other of the contact points 120 of the first ammeter 64a and one of the contact points 124 of the first fuse 66a to each other. The first positive bus bar 54c extends from the first ammeter 64a in the arrow Y1 direction.

Each of the contact points 120 of the first ammeter 64a and the first positive bus bars 54b, 54c are fixed to the support board 100 by bolts 126. As shown in FIG. 9, the base portion 118 of the ammeter 64 is inserted into a through hole 128 formed in the support board 100. The other end of the base portion 118 of the ammeter 64 is positioned on the second surface 106b side of the support board 100.

As shown in FIG. 4, the first junction 56 is electrically connected to the other of the contact points 124 of the first fuse 66a. The first junction 56 is positioned at an end portion in the direction of the arrow Y1. The first junction 56 is formed in a plate shape. The first junction 56 is formed in a quadrangular shape in the front view shown in FIG. 4.

As shown in FIG. 8, the first junction 56 includes a junction body 130, a first heat dissipation plate portion 132, a second heat dissipation plate portion 134, and a plurality of fins 136. The junction body 130 is positioned at an end portion of the first junction 56 in the arrow Y2 direction.

As shown in FIG. 4, the other of the contact points 124 of the first fuse 66a, one of the contact points 124 of the second fuse 66b, and one of the contact points 124 of the third fuse 66c are electrically connected to the junction body 130 of the first junction 56. The junction body 130 of the first junction 56 and the other of the contact points 124 of the first fuse 66a are fixed to the support board 100 by a bolt 140. The same applies to the second fuse 66b and the third fuse 66c. The three bolts 140 are arranged at intervals in the arrow X direction. Two of the three bolts 140 are positioned at the corners of the first junction 56.

As shown in FIG. 8, the first heat dissipation plate portion 132 protrudes from the junction body 130 in the arrow Z1 direction. The second heat dissipation plate portion 134 protrudes in the arrow Y1 direction from the arrow Z1 side end of the first heat dissipation plate portion 132. As shown in FIGS. 4 and 8, the arrow Y1 side end portion of the second heat dissipation plate portion 134 is fixed to the support board 100 by two bolts 142. The two bolts 142 are positioned at the corners of the first junction 56. The number and positions of the bolts 142 for fixing the second heat dissipation plate portion 134 to the support board 100 are appropriately set. The plurality of fins 136 protrude from the junction body 130 and the second heat dissipation plate portion 134 in the arrow Z1 direction. The first heat dissipation plate portion 132 is not provided with the fins 136. The plurality of fins 136 are arranged at intervals in the arrow Y direction. The fins 136 extend in the arrow X direction (see FIG. 4).

As shown in FIG. 4, the second fuse 66b is provided in the second positive conductor 58. The second fuse 66b is positioned in the arrow X2 direction with respect to the first fuse 66a. The second positive conductor 58 includes three second positive bus bars 58a to 58c as the first bus bars 111.

The second positive bus bar 58an electrically connects the other of the contact points 124 of the second fuse 66b and one of the contact points 120 of the second ammeter 64b to each other. The second ammeter 64b is positioned in the arrow X2 direction with respect to the first ammeter 64a. The second positive bus bar 58a is disposed in parallel to the first positive bus bar 54c. The second positive bus bar 58a extends from the second fuse 66b in the arrow Y2 direction. The second positive bus bar 58a is positioned in the arrow X2 direction with respect to the first positive bus bar 54c.

The second positive bus bar 58b electrically connects the other of the contact points 120 of the second ammeter 64b and one of the contact points 116 of the second positive contactor 62b to each other. The second positive contactor 62b is positioned in the arrow Y2 direction with respect to the first positive contactor 62a. The second positive bus bar 58b extends from the second ammeter 64b in the arrow X1 direction, and is then bent in the arrow Y1 direction.

The second positive bus bar 58c electrically connects the other of the contact points 116 of the second positive contactor 62b and the second positive connection terminal 44b to each other. As shown in FIG. 6, the second positive connection terminal 44b is disposed on the first side surface 108a. The second positive connection terminal 44b is positioned in the arrow Y2 direction with respect to the first positive connection terminal 44a.

As shown in FIG. 4, the third fuse 66c is provided in the third positive conductor 60. The third fuse 66c is positioned in the arrow X2 direction with respect to the second fuse 66b. The third positive conductor 60 includes three third positive bus bars 60a to 60c as the first bus bars 111.

The third positive bus bar 60an electrically connects the other of the contact points 124 of the third fuse 66c and one of the contact points 120 of the third ammeter 64c to each other. The third ammeter 64c is positioned in the arrow X2 direction with respect to the second ammeter 64b. The third positive bus bar 60a is disposed in parallel to the second positive bus bar 58a. The third positive bus bar 60a extends from the third fuse 66c in the arrow Y2 direction. The third positive bus bar 60a is positioned in the arrow X2 direction with respect to the second positive bus bar 58a.

The third positive bus bar 60b electrically connects the other of the contact points 120 of the third ammeter 64c and one of the contact points 116 of the third positive contactor 62c to each other. The third positive contactor 62c is positioned at a corner of the support board 100 in the arrows X2 and Y2 directions. The third positive bus bar 60b extends from the third ammeter 64c in the arrow X2 direction.

The third positive bus bar 60c electrically connects the other of the contact points 116 of the third positive contactor 62c and the third positive connection terminal 44c to each other. As shown in FIG. 7, the third positive connection terminal 44c is disposed on the second side surface 108b of the support board 100. The third positive connection terminal 44c is positioned at the end portion of the second side 108b in the arrow Y2 direction.

The fourth positive connection terminal 44d is arranged at the end portion of the second side 108b in the arrow Y1 direction. The fourth positive connection terminal 44d extends from the middle portion of the third side surface 108c in the arrow Z direction to the first surface 106a. The fourth positive conductor 84 is electrically connected to the fourth positive connection terminal 44d. The fourth positive conductor 84 includes three fourth positive bus bars 84a to 84c as the first bus bars 111.

As shown in FIG. 4, the fourth positive bus bar 84an electrically connects the fourth positive connection terminal 44d to one of the contact points 116 of the fourth positive contactor 62d. The fourth positive contactor 62d is positioned in the arrow Y1 direction with respect to the third positive contactor 62c. The fourth positive bus bar 84a extends from the fourth positive connection terminal 44d in the arrow X1 direction.

The fourth positive bus bar 84b electrically connects the other of the contact points 116 of the fourth positive contactor 62d and one of the contact points 120 of the fourth ammeter 64d to each other. The fourth ammeter 64d is positioned in the arrow X2 direction with respect to the third ammeter 64c. The fourth positive bus bar 84b extends from the fourth positive contactor 62d in the arrow Y2 direction.

The fourth positive bus bar 84c electrically connects the other of the contact points 120 of the fourth ammeter 64d and one of the contact points 124 of the fourth fuse 66d to each other. The fourth fuse 66d is positioned in the arrow Y1 direction with respect to the fourth ammeter 64d. The fourth positive bus bar 84c extends from the fourth ammeter 64d in the arrow Y1 direction. The other of the contact points 124 of the fourth fuse 66d is electrically connected to the second junction 86.

The second junction 86 has the same configuration as the first junction 56. Therefore, detailed descriptions of the configuration of the second junction 86 will be omitted. The second junction 86 is arranged with a gap from the first junction 56 in the arrow X2 direction. The first junction 56 and the second junction 86 are electrically separated from each other.

The other of the contact points 124 of the fourth fuse 66d, one of the contact points 124 of the fifth fuse 66e, and one of the contact points 124 of the sixth fuse 66f are electrically connected to the junction body 130 of the second junction 86. The second junction 86 and the other of the contact points 124 of the fourth fuse 66d are fixed to the support board 100 by a bolt 140. The same applies to the fifth fuse 66e and the sixth fuse 66f. The fifth fuse 66e is positioned in the arrow X1 direction with respect to the fourth fuse 66d. The sixth fuse 66f is positioned in the arrow X1 direction with respect to the fifth fuse 66e.

The fifth fuse 66e is provided in the fifth positive conductor 88. The fifth positive conductor 88 includes three fifth positive bus bars 88a to 88c as the first bus bars 111. The fifth positive bus bar 88an electrically connects the other of the contact points 124 of the fifth fuse 66e and one of the contact points 120 of the fifth ammeter 64e to each other. The fifth ammeter 64e is positioned in the arrow X1 direction with respect to the fourth ammeter 64d. The fifth positive bus bar 88a is disposed in parallel to the fourth positive bus bar 84c. The fifth positive bus bar 88a is positioned in the arrow X1 direction with respect to the fourth positive bus bar 84c.

The fifth positive bus bar 88b electrically connects the other of the contact points 120 of the fifth ammeter 64e and one of the contact points 116 of the fifth positive contactor 62e to each other. The fifth positive contactor 62e is positioned in the arrow Y2 direction with respect to the fourth positive contactor 62d. The fifth positive bus bar 88b extends from the fifth ammeter 64e in the arrow X2 direction, and is then bent in the arrow Y1 direction.

The fifth positive bus bar 88c electrically connects the other of the contact points 116 of the fifth positive contactor 62e and the fifth positive connection terminal 44e to each other. The fifth positive connection terminal 44e is disposed on the second side surface 108b of the support board 100. The fifth positive connection terminal 44e is positioned between the third positive connection terminal 44c and the fourth positive connection terminal 44d (see FIG. 7).

The sixth fuse 66f is provided in the sixth positive conductor 90. The sixth positive conductor 90 includes three sixth positive bus bars 90a to 90c as the first bus bars 111. The sixth positive bus bar 90an electrically connects the other of the contact points 124 of the sixth fuse 66f and one of the contact points 120 of the sixth ammeter 64f to each other. The sixth positive bus bar 90a is disposed in parallel to the fifth positive bus bar 88a. The sixth ammeter 64f is positioned in the arrow X1 direction with respect to the fifth ammeter 64e.

The sixth positive bus bar 90b electrically connects the other of the contact points 120 of the sixth ammeter 64f and one of the contact points 116 of the sixth positive contactor 62f to each other. The sixth positive contactor 62f is positioned between the fifth positive contactor 62e and the third positive contactor 62c. The sixth positive bus bar 90b extends from the sixth ammeter 64f in the arrow X2 direction, and is then bent in the arrow Y1 direction.

The sixth positive bus bar 90c electrically connects the other of the contact points 116 of the sixth positive contactor 62f and the sixth positive connection terminal 44f to each other. The sixth positive connection terminal 44f is disposed on the second side surface 108b of the support board 100. The sixth positive connection terminal 44f is positioned between the third positive connection terminal 44c and the fifth positive connection terminal 44e (see FIG. 7).

As shown in FIGS. 5 and 6, the first negative connection terminal 46a is disposed on the first side surface 108a. The first negative connection terminal 46a is adjacent to the first positive connection terminal 44a in the arrow Y2 direction.

As shown in FIG. 5, a first negative conductor 68 is electrically connected to the first negative connection terminal 46a. The first negative conductor 68 includes two first negative bus bars 68a, 68b as the second bus bars 113. The first negative bus bar 68an electrically connects the first negative connection terminal 46a and one of the contact points 116 of the first negative contactor 78a to each other. The first negative bus bar 68a extends from the first negative connection terminal 46a in the arrow Y1 direction. The first negative contactor 78a is positioned at an end portion of the support board 100 in the arrow X1 direction.

The first negative bus bar 68b electrically connects the other of the contact points 116 of the first negative contactor 78a and the first junction 70 to each other. The first negative bus bar 68b extends from the first negative contactor 78a in the arrow Y1 direction.

The first junction 70 is a plate-shaped portion extending in the arrow X direction. A second negative conductor 72 and a third negative conductor 74 are electrically connected to the first junction 70. The second negative conductor 72 includes two second negative bus bars 72a, 72b as the second bus bars 113.

The second negative bus bar 72an electrically connects the first junction 70 and one of the contact points 116 of the second negative contactor 78b to each other. The second negative bus bar 72a is positioned in the arrow X2 direction with respect to the first negative bus bar 68b. The second negative bus bar 72a extends from the first junction 70 in the arrow Y2 direction. The second negative contactor 78b is positioned in the arrow X2 direction with respect to the first negative contactor 78a.

The second negative bus bar 72b electrically connects the other of the contact points 116 of the second negative contactor 78b and the second negative connection terminal 46b to each other. The second negative bus bar 72b extends from the second negative contactor 78b in the arrow Y2 direction, and is then bent in the arrow X1 direction. As shown in FIG. 6, the second negative connection terminal 46b is disposed on the first side surface 108a of the support board 100. The second negative connection terminal 46b is adjacent to the second positive connection terminal 44b in the arrow Y1 direction.

As shown in FIG. 5, the third negative conductor 74 includes two third negative bus bars 74a, 74b as the second bus bars 113. The third negative bus bar 74an electrically connects the first junction 70 and one of the contact points 116 of the third negative contactor 78c. The third negative bus bar 74a is positioned in the arrow X2 direction with respect to the second negative bus bar 72a. The third negative bus bar 74a extends from the first junction 70 in the arrow Y2 direction. The third negative contactor 78c is positioned in the arrow X2 direction with respect to the second negative contactor 78*b*.

As shown in FIG. 8, the third negative contactor 78*c* is positioned on the back side of the second heat dissipation plate portion 134 of the first junction 56. In other words, the third negative contactor 78*c* and the second heat dissipation plate portion 134 of the first junction 56 are disposed to face each other with the support main body 102 interposed therebetween. The support board 100 includes first fixing portions 150 to which the first junction 56 is fixed and a second fixing portions 152 to which the third negative contactor 78*c* is fixed. The bolts 140, 142 for fixing the first junction 56 are attached to the first fixing portions 150 of the support board 100. The bolts 154 for fixing the third negative contactor 78*c* are attached to the second fixing portions 152 of the support board 100. The first fixing portion 150 and the second fixing portion 152 are adjacent to each other.

As shown in FIG. 5, the third negative bus bar 74*b* electrically connects the other of the contact points 116 of the third negative contactor 78*c* and the third negative connection terminal 46*c* to each other. The third negative bus bar 74*b* extends from the third negative contactor 78*c* in the arrow Y2 direction so as to be inclined in the arrow X2 direction. Six through holes 128 into which the ammeters 64 are inserted are arranged in the arrow X direction on the second surface 106*b* of the support board 100 in the area on the arrow X1 direction side of the third negative bus bar 74*b*.

As shown in FIG. 7, the third negative connection terminal 46*c* is disposed on the second side surface 108*b* of the support board 100. The third negative connection terminal 46*c* is adjacent to the third positive connection terminal 44*c* in the arrow Y1 direction.

The fourth negative connection terminal 46*d* is disposed on the second side surface 108*b* of the support board 100. The fourth negative connection terminal 46*d* is adjacent to the fourth positive connection terminal 44*d* in the arrow Y2 direction.

As shown in FIG. 5, a fourth negative conductor 92 is electrically connected to the fourth negative connection terminal 46*d*. The fourth negative conductor 92 includes two fourth negative bus bars 92*a*, 92*b* as the second bus bars 113. The fourth negative bus bar 92*an* electrically connects the fourth negative connection terminal 46*d* and one of the contact points 116 of the fourth negative contactor 78*d* to each other. The fourth negative bus bar 92*a* extends from the fourth negative connection terminal 46*d* in the arrow X direction. The fourth negative contactor 78*d* is positioned in the arrow X2 direction with respect to the third negative contactor 78*c*.

The fourth negative bus bar 92*b* electrically connects the other of the contact points 116 of the fourth negative contactor 78*d* and the second junction 94 to each other. The fourth negative bus bar 92*b* extends from the fourth negative contactor 78*d* in the arrow Y1 direction.

The second junction 94 is a plate-shaped portion extending in the arrow X direction. The second junction 94 is positioned in the arrow X2 direction with respect to the first junction 70. A fifth negative conductor 96 and a sixth negative conductor 98 are electrically connected to the second junction 94. The fifth negative conductor 96 includes two fifth negative bus bars 96*a*, 96*b* as the second bus bars 113.

The fifth negative bus bar 96*an* electrically connects the second junction 94 and one of the contact points 116 of the fifth negative contactor 78*e* to each other. The fifth negative bus bar 96*a* extends from the second junction 94 in the arrow Y2 direction.

The fifth negative bus bar 96*b* electrically connects the other of the contact points 116 of the fifth negative contactor 78*e* and the fifth negative connection terminal 46*e* to each other. The fifth negative bus bar 96*b* extends from the fifth negative contactor 78*e* in the arrow Y2 and arrow X2 direction. The fifth negative contactor 78*e* is positioned in the arrow X1 direction with respect to the fourth negative contactor 78*d*. The fifth negative contactor 78*e* is positioned on the back side of the second heat dissipation plate portion 134 of the second junction 86. As shown in FIG. 7, the fifth negative connection terminal 46*e* is disposed on the second side surface 108*b* of the support board 100. The fifth negative connection terminal 46*e* is adjacent to the fifth positive connection terminal 44*e* in the arrow Y1 direction.

As shown in FIG. 5, the sixth negative conductor 98 includes two sixth negative bus bars 98*a* and 98*b* as the second bus bars 113. The sixth negative bus bar 98*an* electrically connects the second junction 94 and one of the contact points 116 of the sixth negative contactor 78*f* to each other. The sixth negative bus bar 98*a* is positioned in the arrow X1 direction with respect to the fifth negative bus bar 96*a*. The sixth negative bus bar 98*a* extends from the second junction 94 in the arrow Y2 direction. The sixth negative contactor 78*f* is positioned in the arrow X1 direction with respect to the fifth negative contactor 78*e*.

The sixth negative bus bar 98*b* electrically connects the other of the contact points 116 of the sixth negative contactor 78*f* and the sixth negative connection terminal 46*f* to each other. The sixth negative bus bar 98*b* extends from the sixth negative contactor 78*f* in the arrow Y2 and arrow X2 direction. As shown in FIG. 7, the sixth negative connection terminal 46*f* is disposed on the second side surface 108*b* of the support board 100. The sixth negative connection terminal 46*f* is adjacent to the sixth positive connection terminal 44*f* in the arrow Y2 direction.

As shown in FIGS. 6 and 7, in the electric power device 10, the first set of terminals 52*a* and the second set of terminals 52*b* are arranged on the first side surface 108*a* of the support board 100, and the third set of terminals 52*c*, the fourth set of terminals 52*d*, the fifth set of terminals 52*e* and the sixth set of terminals 52*f* are arranged on the second side surface 108*b* of the support board 100. Hereinafter, the first to sixth sets of terminals 52*a* to 52*f* may be simply referred to as sets of terminals 52.

As shown in FIGS. 4 to 7, an insulation projection 156 is provided between adjacent sets of terminals 52 for electrically insulating the sets of terminals 52 from each other. Further, for each set of terminals 52, an insulation projection 158 is provided between the positive connection terminal 44 and the negative connection terminal 46 for electrically separating the positive connection terminal 44 and the negative connection terminal 46. As shown in FIG. 6, the distance L2 between the adjacent sets of terminals 52 is larger than the distance L1 between the positive connection terminal 44 and the negative connection terminal 46.

According to the present embodiment, the first circuit portion 110 is disposed on the first surface 106*a* of the support board 100, and the second circuit portion 112 is disposed on the second surface 106*b* of the support board 100, whereby the first circuit portion 110 and the second circuit portion 112 are electrically separated from each other by the support board 100. The support board 100 has electrical insulation properties and a certain thickness. Therefore, the positive electrode and the negative electrode of the direct current circuit 38 can be reliably insulated from each other with a simple configuration. The first and second sets of terminals 52*a*, 52*b* are disposed on the first side surface 108a, and the third to sixth sets of terminals 52c to 52f are disposed on the second side surface 108b. In this way, it is possible to gather cables to be connected to the electric power device 10 together. Therefore, the electric power device 10 can be prevented from becoming large.

In the electric power device 10, as shown in FIG. 10, the through hole 128 of the support board 100 may be blocked by a wall portion 160. In this case, the ammeter 64 can be attached in a vertically inverted state.

In relation to the above-described disclosure, the following supplementary notes are further disclosed.

APPENDIX 1

The electric power device (10) including the direct current circuit (38) and the support board (100) having electrical insulation properties and configured to support the direct current circuit, wherein the direct current circuit including the positive connection terminal (44) and the negative connection terminal (46), each configured to be connected to an external circuit; the first circuit portion (110) including the first bus bar (111) electrically connected to one of the positive connection terminal or the negative connection terminal; and the second circuit portion (112) including a second bus bar (113) electrically connected to another of the positive connection terminal or the negative connection terminal, the first circuit portion disposed on the first surface (106a) of the support board and the second circuit portion disposed on the second surface (106b) of the support board are electrically separated from each other by the support board, and the set (52) of the positive connection terminal and the negative connection terminal which are paired is arranged on the same side surface (108a, 108b) of the support board.

In accordance with such a configuration, the first circuit portion is disposed on the first surface of the support board, and the second circuit portion is disposed on the second surface of the support board, and thus it is possible to reliably insulate the positive electrode and the negative electrode of the direct current circuit with a simple configuration. Further, since the set of terminals is disposed on the same side surface of the support board, it is possible to gather cables to be connected to the electric power device. This can suppress an increase in the size of the electric power device.

APPENDIX 2

In the electric power device according to Appendix 1, the set of the terminals may include multiple sets of the terminals, and the multiple sets of the terminals may be arranged on different side surfaces of the support board.

According to such a configuration, since multiple sets of terminals are arranged on different side surfaces, the effect of insulation of the sets of terminals can be enhanced.

APPENDIX 3

In the electric power device according to Appendix 2, the different side surfaces on which the multiple sets of the terminals are arranged may be opposite side surfaces of the support board facing in opposite directions.

According to such a configuration, the effect of insulation of the plurality of sets of terminals can be further enhanced. In addition, it is possible to suppress cables connected to the plurality of sets of terminals from being entangled with each other.

APPENDIX 4

In the electric power device according to any one of the Appendices 1 to 3, the set of the terminals may be the multiple sets of the terminals, the multiple sets of the terminals are arranged on the same side surface, and the distance (L2) between the multiple sets of the terminals arranged adjacent to each other may be larger than the distance (L1) between the positive connection terminal and the negative connection terminal forming each of the adjacent two of the polarity of sets of terminals.

In accordance with such a configuration, it is possible to suppress erroneous assembly of cables to be connected to the sets of terminals while insulating the sets of terminal arranged adjacent to each other.

APPENDIX 5

In the electric power device according to any one of Appendices 1 to 4, in the first circuit portion, the first bus bar may be provided with a plurality of contactors (62), and the plurality of contactors may be arranged along the side surface of the support board on which the set of terminals is arranged.

In accordance with such a configuration, the length of the first bus bar between the connection terminal and the contactor can be shortened.

APPENDIX 6

In the electric power device according to any one of the Appendices 1 to 5, the first circuit portion may include at least three of the first bus bars and a plurality of junctions (56, 86) to which the at least three first bus bars are electrically connected, the plurality of junctions each having a plate shape, and the plurality of junctions may be disposed on the support board in a state of being separated from each other.

In accordance with such a configuration, heat can be efficiently dissipated by the plate-shaped junctions. Further, since the plurality of junctions are separated from each other, the plurality of junctions can be insulated.

APPENDIX 7

In the electric power device according to any one of Appendices 1 to 6, the first circuit portion may include at least three of the first bus bars and a junction to which the at least three first bus bars are connected, the junction having a plate shape, the second circuit portion may include a contactor (78) provided on the second bus bar, the support board may include a first fixing portion (150) to which the junction is fixed and a second fixing portion (152) to which the contactor is fixed, and the first fixing portion may be adjacent to the second fixing portion.

In accordance with such a configuration, the second fixing portion supporting the contactor can be reinforced by the plate-shaped junction. This can suppress the support board from being bent by the contactor.

APPENDIX 8

A moving object (12) includes the electric power device according to any one of Appendixes 1 to 7.

Moreover, it should be noted that the present invention is not limited to the disclosure described above, and various configurations may be adopted therein without departing from the essence and gist of the present invention.

The invention claimed is:

1. An electric power device, comprising:
   a direct current circuit; and
   a support board having electrical insulation properties and configured to support the direct current circuit, wherein the direct current circuit comprises:
      a positive connection terminal and a negative connection terminal, each configured to be connected to an external circuit;
      a first circuit portion including a first bus bar electrically connected to one of the positive connection terminal or the negative connection terminal; and
      a second circuit portion including a second bus bar electrically connected to another of the positive connection terminal or the negative connection terminal,
   the first circuit portion disposed on a first surface of the support board and the second circuit portion disposed on a second surface of the support board are electrically separated from each other by the support board, and
   a set of the positive connection terminal and the negative connection terminal which are paired is arranged on a same side surface of the support board.

2. The electric power device according to claim 1, wherein
   the set of the terminals includes multiple sets of the terminals, and
   the multiple sets of the terminals are arranged on different side surfaces of the support board.

3. The electric power device according to claim 2, wherein
   the different side surfaces on which the multiple sets of terminals are arranged are opposite side surfaces of the support board facing in opposite directions.

4. The electric power device according to claim 1, wherein
   the set of the terminals includes multiple sets of the terminals,
   the multiple sets of terminals are arranged on the same side surface, and
   a distance between the multiple sets of the terminals arranged adjacent to each other is larger than a distance between the positive connection terminal and the negative connection terminal forming each of the multiple sets of the terminals.

5. The electric power device according to claim 1, wherein
   in the first circuit portion, the first bus bar is provided with a plurality of contactors, and
   the plurality of contactors are arranged along the side surface of the support board on which the set of terminals is arranged.

6. The electric power device according to claim 1, wherein
   the first circuit portion includes at least three of the first bus bars and a plurality of junctions to which the at least three first bus bars are electrically connected, the plurality of junctions each having a plate shape, and
   the plurality of junctions are disposed on the support board in a state of being separated from each other.

7. The electric power device according to claim 1, wherein
   the first circuit portion includes at least three of the first bus bars and a junction to which the at least three first bus bars are connected, the junction having a plate shape,
   the second circuit portion includes a contactor provided on the second bus bar,
   the support board includes:
   a first fixing portion to which the junction is fixed; and
   a second fixing portion to which the contactor is fixed, and
   the first fixing portion is adjacent to the second fixing portion.

8. A moving object comprising the electric power device according to claim 1.

* * * * *